United States Patent
Kuo et al.

(10) Patent No.: US 8,665,390 B2
(45) Date of Patent: Mar. 4, 2014

(54) FLAT PANEL DISPLAY DEVICE, STEREOSCOPIC DISPLAY DEVICE, AND PLASMA DISPLAY DEVICE

(75) Inventors: Yi-Cheng Kuo, Shenzhen (CN); Yu-Chun Hsiao, Shenzhen (CN); Chong Huang, Shenzhen (CN); Jia-He Cheng, Shenzhen (CN); Cheng-Wen Que, Shenzhen (CN); Quan Li, Shenzhen (CN); Liu-Yang Yang, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 151 days.

(21) Appl. No.: 13/381,905

(22) PCT Filed: Nov. 23, 2011

(86) PCT No.: PCT/CN2011/082690
§ 371 (c)(1),
(2), (4) Date: Dec. 31, 2011

(87) PCT Pub. No.: WO2013/071561
PCT Pub. Date: May 23, 2013

(65) Prior Publication Data
US 2013/0128157 A1    May 23, 2013

(51) Int. Cl.
*G02F 1/1333* (2006.01)
*F21V 7/04* (2006.01)
*H05K 7/20* (2006.01)
*H05K 5/00* (2006.01)
*H04N 5/64* (2006.01)

(52) U.S. Cl.
USPC ............. 349/58; 362/632; 362/633; 362/634; 361/714; 361/752; 348/794

(58) Field of Classification Search
USPC ................. 349/58; 362/632–634; 345/905; 361/681, 714, 752, 644, 728–730, 679; 348/794, E5.128; 313/582–587, 313/498–512
See application file for complete search history.

(56) References Cited

U.S. PATENT DOCUMENTS

| 7,468,838 B2 * | 12/2008 | Cha et al. ............... 359/465 |
| 2010/0079942 A1 * | 4/2010 | Yamamoto et al. ........ 361/690 |

FOREIGN PATENT DOCUMENTS

| CN | 101150942 | * | 9/2006 |
| CN | 102200259 | * | 3/2010 |
| CN | 201757332 | * | 7/2010 |

*Primary Examiner* — Bumsuk Won
*Assistant Examiner* — Jia Pan
(74) *Attorney, Agent, or Firm* — Cheng-Ju Jiang

(57) ABSTRACT

The present invention provides a flat panel display device, which includes a backlight system and a display panel. The backlight system includes a light source, a light homogenization mechanism, and a back frame. The back frame carries the light source and the light homogenization mechanism, and the light homogenization mechanism guides light from the light source into the display panel. The back frame includes at least two primary assembling pieces and also includes secondary assembling pieces and a bracing piece for fixing a circuit board. According to practical needs of the main frame structure, different materials are used for different parts at different locations. The back frame is provided with the bracing piece for fixing a circuit board, and the bracing piece includes a bracing body, a first suspension section, a first bearing section, and a first resilient bent section. The present invention also provides a stereoscopic display device and a plasma display device. The flat panel display device, the stereoscopic display device, and the plasma display device of the present invention have a back frame having a simple structure, overcome the problem that a circuit cannot be easily fixed, reduce the expenditure of a back frame mold, and save the material used for back frame so as to lower down the cost of flat panel display device.

16 Claims, 10 Drawing Sheets

27

27

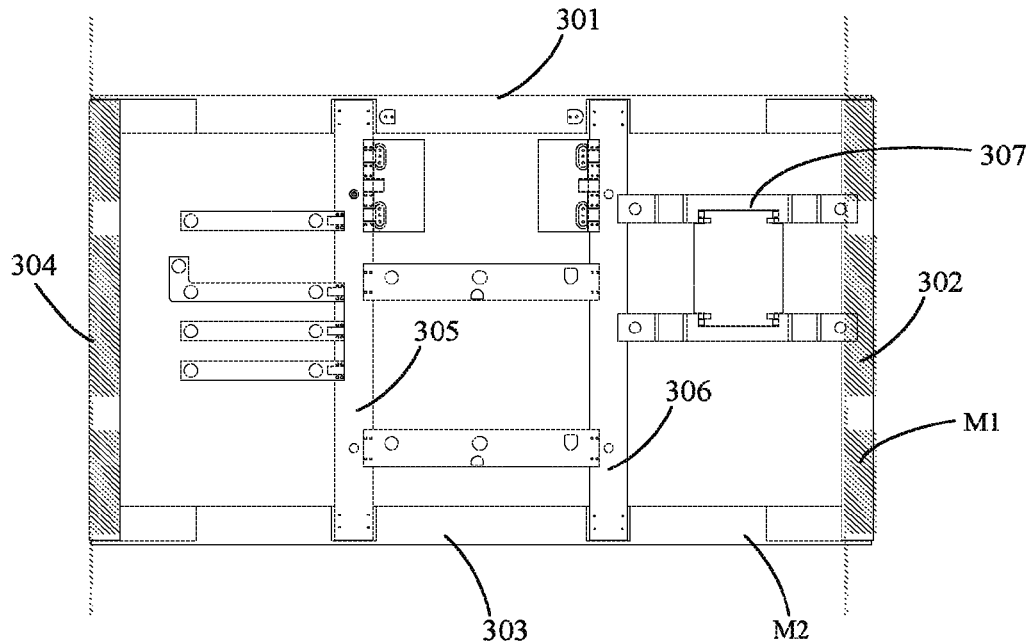

FIG.20

| Manufacturing at least two primary assembling pieces, the at least two primary assembling pieces comprising a primary assembling piece that carries a heat source, the primary assembling piece that carries the heat source having a first heat transfer capability, and the remaining one or more primary assembling pieces of the at least two primary assembling pieces that carry no heat source having a second heat transfer capability, the first heat transfer capability being greater than the second heat transfer capability | 501 |

↓

| Joining the at least two primary assembling pieces to form a main frame structure of the back frame, a bracing piece being mounted to the back frame for fixing a circuit board | 502 |

FIG.21

FLAT PANEL DISPLAY DEVICE, STEREOSCOPIC DISPLAY DEVICE, AND PLASMA DISPLAY DEVICE

BACKGROUND OF THE INVENTION

1. Field of the Invention

The present invention relates to the field of displaying techniques, and in particular to a flat panel display device, a stereoscopic display device, and a plasma display device.

2. The Related Arts

The state-of-the-art liquid crystal display device comprises a front bezel, a panel, and a backlight module, of which the backlight module comprises a back frame, a reflector plate, a light guide, and a lighting assembly.

Currently, a variety of display panels of different sizes are available in the market to meet different needs of general consumers. For example, in the field of television set, the sizes of liquid crystal panels include 31.5, 42, 46, 48, and 55 inches. Different back frame molds are provided for liquid crystal planes of different sizes.

Referring to FIG. 1, FIG. 1 is a schematic view showing a conventional back frame of liquid crystal display device. As shown in FIG. 1, the conventional back frame 10 is a unitary back frame, and it is often that a unitary back frame 10 is made with metal stamping or plastic injection molding. The unitary back frame 10 consumes much material and has a high material cost. Further, a large-sized back frame 10 requires large-sized stamping equipment, and the size of mold corresponding to such a back frame 10 is large and the structure complicated, making the expenditure of the back frame mold high. As a consequence, the conventional back frame is of a high cost.

Further, aluminum or galvanized steel are commonly used as raw material for backlight module and is subjected to stamping to make a unitary back panel. Aluminum has better performance of heat dissipation and is advantageous in extending lifespan of product. Galvanized steel has worse performance of heat dissipation, but the price is relatively low. In the cost of a back panel, the material cost takes the greatest percentage. If the whole back panel is made of aluminum material, then the cost is extremely high and the structural strength is poor. If it is completely made of galvanized steel plates, then the heat dissipation will be poor and the product performance will be deteriorated. Thus, it is an important issue of the technology to ensure product quality and save material cost in order to lower down the overall product cost.

SUMMARY OF THE INVENTION

The technical issue to be addressed by the present invention is to provide a flat panel display device, a stereoscopic display device, and a plasma display device, which lower material cost and mold cost and overcome the problem that a circuit board cannot be easily fixed.

To address the above technical issue, the present invention adopts a technical solution that provides a flat panel display device, which comprises a backlight system and a display panel; the backlight system comprises a light source, a light homogenization mechanism, and a back frame; the back frame carries the light source and the light homogenization mechanism, the light homogenization mechanism guiding light from the light source into the display panel; the back frame comprises at least two primary assembling pieces and also comprises secondary assembling pieces and a bracing piece for fixing a circuit board; the primary assembling pieces have a number of at least two, the at least two primary assembling pieces being connected through joining to form a main frame structure of the back frame, the secondary assembling pieces being joined to the primary assembling pieces; the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; and the bracing piece is provided for fixing a circuit board, the bracing piece comprising a bracing body, a first suspension section, a first bearing section, and a first resilient bent section, the bracing body being fixed to the primary assembling pieces or the secondary assembling pieces or both of the primary assembling pieces and the secondary assembling pieces, the first suspension section extending from the bracing body toward one side of the bracing body, the first bearing section being spaced from the bracing body and extending from the first suspension section toward one side of the first suspension section, the first resilient bent section being located between the first bearing section and the bracing body and being bent from the first suspension section toward one side of the first suspension section, the first bearing section and the first resilient bent section resiliently clamping a first side edge of the circuit board.

According to a preferred embodiment of the present invention, the primary assembling piece that has the heat source arranged thereon has a first strength, the remaining one or more primary assembling pieces of the at least two primary assembling pieces that have no heat source arranged thereon having a second strength, the second strength being greater than the first strength.

According to a preferred embodiment of the present invention, the primary assembling piece that has the first heat transfer capability and the first strength is an aluminum piece and the primary assembling pieces that have the second heat transfer capability and the second strength are galvanized steel pieces.

According to a preferred embodiment of the present invention, the bracing piece further comprises a second suspension section, a second bearing section, and a second resilient bent section, the second suspension section being spaced from the first suspension section and extending from the bracing body toward one side of the bracing body, the second bearing section being spaced from the bracing body and extending from the second suspension section toward one side of the second suspension section, the second resilient bent section being located between the second bearing section and the bracing body and extending from the second suspension toward one side of the second suspension section, the second bearing section and the second resilient bent section resiliently clamping a second side edge of the circuit board that is opposite to the first side edge.

According to a preferred embodiment of the present invention, the back frame comprises two bracing pieces and the two bracing pieces are spaced from each other to clamp different locations of the first side edge and the second side edge of the circuit board, the bracing body being of step-like configuration and bridging between the two assembling pieces.

According to a preferred embodiment of the present invention, the at least two primary assembling pieces comprise a first primary assembling piece and a second primary assembling piece that are joined to each other, wherein the first primary assembling piece has an end having a surface forming at least joint sections that are arranged to space from each other in a lengthwise direction of the first primary assembling piece, the first primary assembling piece using one of the joint sections thereof to join a corresponding end of the second primary assembling piece in order to form a main frame structure of the back frame having different sizes.

According to a preferred embodiment of the present invention, the joint sections comprise recesses formed in a surface of the first primary assembling piece and having a shape corresponding to the end of the second primary assembling piece for receiving the end of the second primary assembling piece.

According to a preferred embodiment of the present invention, the joint sections comprise recesses formed in the surface of the first primary assembling piece, the second primary assembling piece having an end having a surface forming protrusions at corresponding positions that are arranged to space from each other in a lengthwise direction of the second primary assembling piece, the protrusions being receivable in the recesses to join the first primary assembling piece and the second primary assembling piece to each other.

According to a preferred embodiment of the present invention, the back frame comprises a third primary assembling piece and a fourth primary assembling piece; and the first primary assembling piece, the second primary assembling piece, the third primary assembling piece, and the fourth primary assembling piece are connected to each other in a leading end-to-tailing end manner through screwing, fastening or welding to form a rectangular main frame structure of the back frame.

According to a preferred embodiment of the present invention, the back frame comprises secondary assembling pieces arranged in the main frame structure, the secondary assembling pieces being joined to the main frame structure.

According to a preferred embodiment of the present invention, the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

According to a preferred embodiment of the present invention, the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other.

According to a preferred embodiment of the present invention, the flat panel display device comprises a touch screen and the touch screen is positioned on a light exit surface of the display panel.

To address the above technical issue, the present invention adopts a technical solution that provides a stereoscopic display device. The stereoscopic display device comprises a liquid crystal lens grating, a backlight system, and a display panel, the liquid crystal lens grating being arranged on a light exit surface of the display panel; the backlight system comprises a light source, a light homogenization mechanism, and a back frame; the back frame carries the light source and the light homogenization mechanism, the light homogenization mechanism guiding light from the light source to a light incidence surface of the display panel; the back frame comprises at least two primary assembling pieces and also comprises secondary assembling pieces and a bracing piece for fixing a circuit board; the primary assembling pieces have a number of at least two, the at least two primary assembling pieces being connected through joining to form a main frame structure of the back frame, the secondary assembling pieces being joined to the primary assembling pieces; the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; and the bracing piece is provided for fixing a circuit board, the bracing piece comprising a bracing body, a first suspension section, a first bearing section, and a first resilient bent section, the bracing body being fixed to the primary assembling pieces or the secondary assembling pieces or both of the primary assembling pieces and the secondary assembling pieces, the first suspension section extending from the bracing body toward one side of the bracing body, the first bearing section being spaced from the bracing body and extending from the first suspension section toward one side of the first suspension section, the first resilient bent section being located between the first bearing section and the bracing body and being bent from the first suspension section toward one side of the first suspension section, the first bearing section and the first resilient bent section resiliently clamping a first side edge of the circuit board.

Wherein, the primary assembling pieces comprise a first primary assembling piece, a second primary assembling piece, a third primary assembling piece, and a fourth primary assembling piece; and the first primary assembling piece, the second primary assembling piece, the third primary assembling piece, and the fourth primary assembling piece are joined to form a main frame structure of the back frame.

To address the above technical issue, the present invention adopts a technical solution that provides a plasma display device, which comprises a plasma display panel and a back frame, the back frame being arranged at a back side of the plasma display panel; the back frame comprises at least two primary assembling pieces and also comprises secondary assembling pieces and a bracing piece for fixing a circuit board; the primary assembling pieces have a number of at least two, the at least two primary assembling pieces being connected through joining to form a main frame structure of the back frame, the secondary assembling pieces being joined to the primary assembling pieces; the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; and the bracing piece is provided for fixing a circuit board, the bracing piece comprising a bracing body, a first suspension section, a first bearing section, and a first resilient bent section, the bracing body being fixed to the primary assembling pieces or the secondary assembling pieces or both of the primary assembling pieces and the secondary assembling pieces, the first suspension section extending from the bracing body toward one side of the bracing body, the first bearing section being spaced from the bracing body and extending from the first suspension section toward one side of the first suspension section, the first resilient bent section being located between the first bearing section and the bracing body and being bent from the first suspension section toward one side of the first suspension section, the first bearing section and the first resilient bent section resiliently clamping a first side edge of the circuit board.

Wherein, the primary assembling pieces comprise a first primary assembling piece, a second primary assembling piece, a third primary assembling piece, and a fourth primary assembling piece; and the first primary assembling piece, the second primary assembling piece, the third primary assembling piece, and the fourth primary assembling piece are joined to form a main frame structure of the back frame.

The efficacy of the present invention is that to be distinguished from the state of the art, the present invention provides a flat panel display device, a stereoscopic display device, and a plasma display device that use at least two primary assembling pieces of which a primary assembling piece that has a heat source arranged thereon has a heat transfer capability greater than the remaining one or more primary assembling pieces that have no heat source arranged thereon, based on which different materials are selected to ensue the need of heat dissipation while lowering the material cost. Further, a joined back frame is used so as to reduce the expenditure of a back frame mold and save the material used for back frame so as to lower down the cost of flat panel display device. Further, a bracing piece that comprises a bracing body, a first suspension section, a first bearing section, and a first resilient bent section is used to fix a circuit board, so as to overcome the problem that the circuit is cannot be easily fixed.

BRIEF DESCRIPTION OF THE DRAWINGS

FIG. 20 is a schematic view showing a back frame of flat panel display device according to a seventeenth embodiment of the present invention;

FIG. 21 is a flow chart showing a method for manufacturing a back frame of a flat panel display device according to an eighteenth of the present invention;

DETAILED DESCRIPTION OF THE PREFERRED EMBODIMENTS

Figure 1:
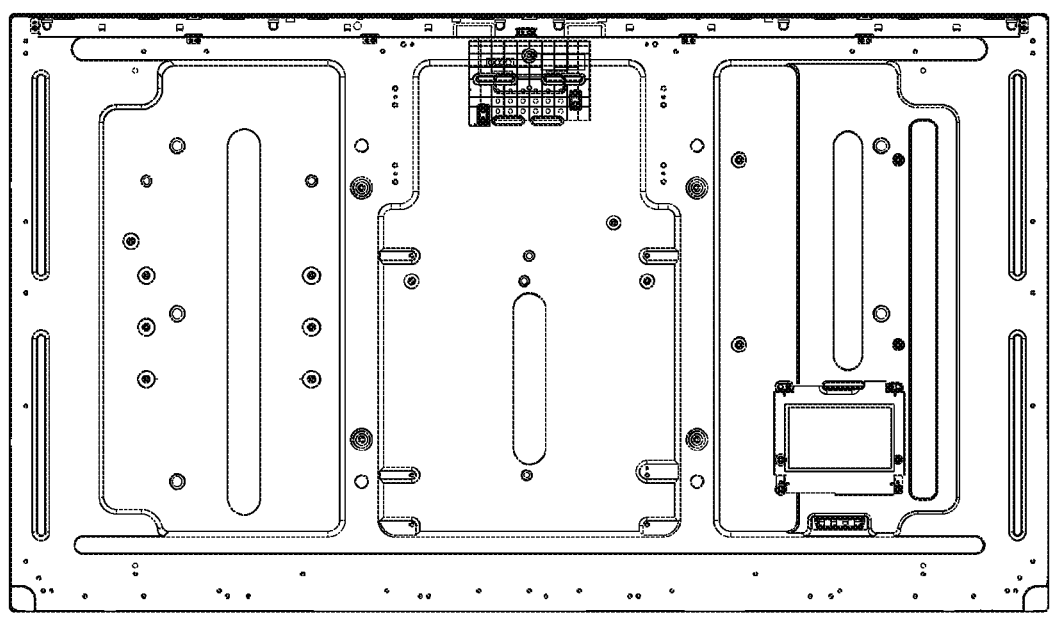
FIG. 1 is a schematic view showing a conventional back frame of liquid crystal display device.
Figure 2:
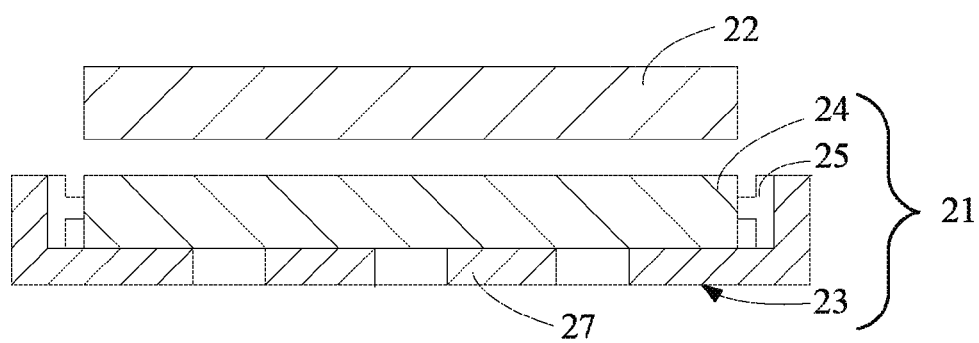
FIG. 2 is a schematic view showing a flat panel display device according to a first embodiment of the present invention.
Figure 3:
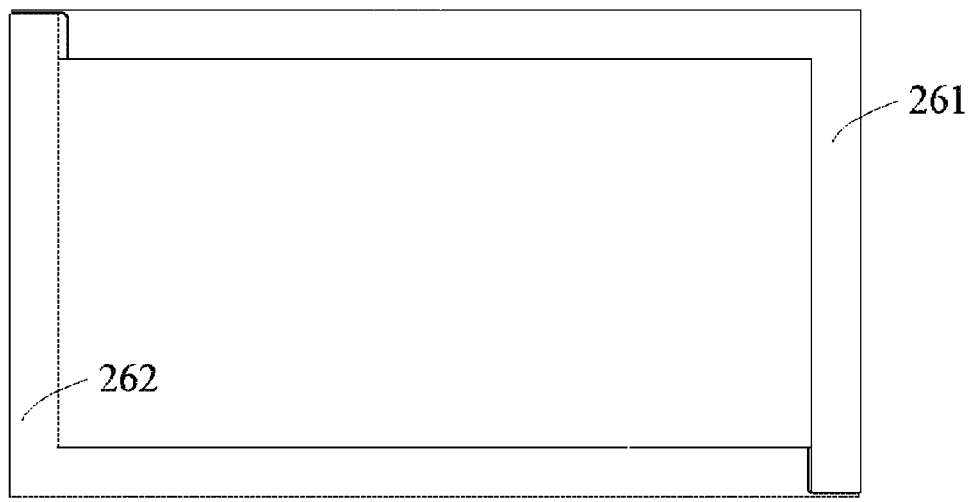
FIG. 3 is a schematic view showing a back frame of a flat panel display device according to a second embodiment of the present invention.

Referring to FIGS. 2-3, FIG. 2 is a schematic view showing a flat panel display device according to a first embodiment of the present invention and FIG. 3 is a schematic view showing a first embodiment of a back frame of a flat panel display device according to a second embodiment of the present invention. As shown in FIG. 2, the flat panel display device 20 according to the instant embodiment comprises: a backlight system 21 and a display panel 22. The backlight system 21 is arranged on a back side of the display panel 22 and supplies light to the display panel 22.

In the instant embodiment, the backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the two of at least first and second primary assembling pieces constitute a main frame structure 27 of the back frame 23.

Referring also to FIG. 3, the back frame 23 of the first embodiment comprises a first primary assembling piece 261 and a second primary assembling piece 262. The first primary assembling piece 261 has an end joined to an end of the second primary assembling piece 262, and the first primary assembling piece 261 has another end joined to another end of the second primary assembling piece 262 in order to form the main frame structure 27 of the back frame 23. The first primary assembling piece 261 and the second primary assembling piece 262 are both aluminum pieces or galvanized steel pieces. In the instant embodiment, the first primary assembling piece 261 and the second primary assembling piece 262 are L-shaped.

Figure 4:
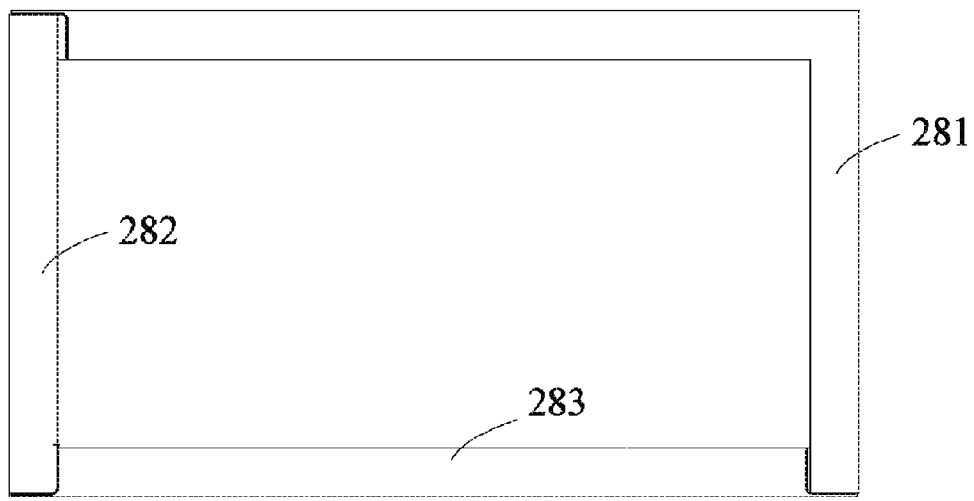
FIG. 4 is a schematic view showing a back frame of a flat panel display device according to a third embodiment of the present invention.

Referring also to FIG. 4, the back frame 23 of a third embodiment comprises a first primary assembling piece 281, a second primary assembling piece 282, and a third primary assembling piece 283. The three primary assembling pieces 281, 282, and 283 are assembled and joined to form a main frame structure 27 of the back frame 23. The three primary assembling pieces 281, 282, and 283 are all aluminum pieces or galvanized steel pieces. An end of the first primary assembling piece 281 is joined to an end of the second primary assembling piece 282. Another end of the second primary assembling piece 282 is joined to an end of the third primary assembling piece 283. Another end of the third primary assembling piece 283 is joined to another end of the first primary assembling piece 281.

In the instant embodiment, the first primary assembling piece 281 is L-shaped, and the second and third primary assembling pieces 282, 283 are straight linear.

Further, the back frame 23 further comprises secondary assembling pieces arranged inside and joined to the main frame structure 27.

A detailed description will be given to the back frame 23 of the flat panel display device 20 according to the present invention, which comprises four primary assembling pieces and two secondary assembling pieces.

Figure 5:
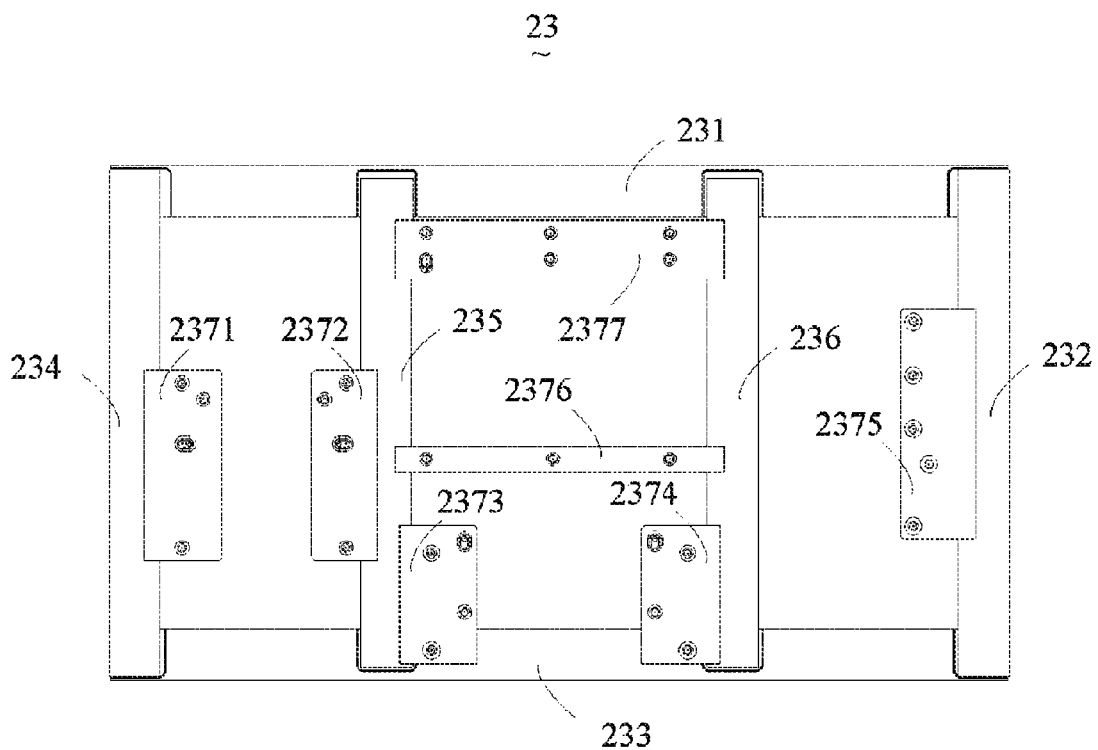
FIG. 5 is a schematic view showing a back frame of a flat panel display device according to a fourth embodiment of the present invention.

Referring to FIG. 5, FIG. 5 is a schematic view showing a back frame of flat panel display device according to a fourth embodiment of the present invention. As shown in FIG. 5, in the instant embodiment, a back frame 23 comprises: a first primary assembling piece 231, a second primary assembling piece 232, a third primary assembling piece 233, a fourth primary assembling piece 234, a first secondary assembling piece 235, a second secondary assembling piece 236, and bracing pieces 2371, 2372, 2373, 2374, 2375, 2376, and 2377. The first primary assembling piece 231, the second primary assembling piece 232, the third primary assembling piece 233, and the fourth primary assembling piece 234 are joined to each other in a leading end-to-tailing end manner to constitute a rectangular main frame structure 27 of the back frame 23. The first secondary assembling piece 235 and the second secondary assembling piece 236, serving as ancillary assembling pieces, are arranged in the main frame structure 27 and joined to the main frame structure 27.

Specifically, an end of the first primary assembling piece 231 is joined to an end of the second primary assembling piece 232, another end of the second primary assembling piece 232 is joined to an end of the third primary assembling piece 233, another end of the third primary assembling piece 233 is joined to an end of the fourth primary assembling piece 234, and another end of the fourth primary assembling piece 234 is joined to another end of the first primary assembling piece 231 in order to form the rectangular main frame structure 27. The first primary assembling piece 231, the second primary assembling piece 232, the third primary assembling piece 233, and the fourth primary assembling piece 234 are all aluminum pieces or galvanized steel pieces. In the instant embodiment, the first primary assembling piece 231, the second primary assembling piece 232, the third primary assembling piece 233, and the fourth primary assembling piece 234 are straight linear, yet in other embodiments, it is apparent to those skilled in the art to make all the first primary assembling piece 231, the second primary assembling piece 232, the third primary assembling piece 233, and the fourth primary assembling piece 234 L-shaped, or some being straight linear and the remaining being L-shaped. For example, in FIG. 3, the first primary assembling piece 261 and the second primary assembling piece 262 are both L-shaped; in FIG. 4, the first primary assembling piece 281 is L-shaped, while the second and third primary assembling pieces 282 and 283 are straight linear.

Figure 6:
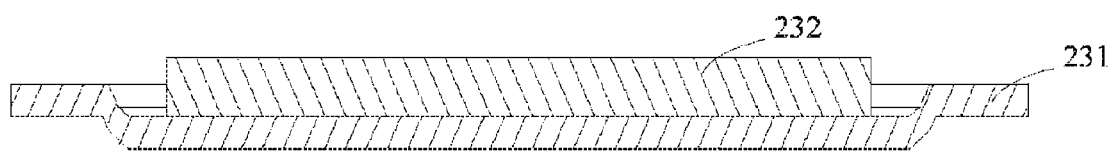
FIG. 6 is a cross-sectional view showing a joining structure of two primary assembling pieces of a flat panel display device according to a fifth embodiment of the present invention.

Referring to FIG. 6, FIG. 6 is a cross-sectional view showing a joining structure of two primary assembling pieces of a flat panel display device according to a fifth embodiment of the present invention. In the instant embodiment, the back frame 23 of the flat panel display device 20 is formed by joining connection. As shown in FIG. 6, an illustrative example is given for the connection of an end of the first primary assembling piece 231 to an end of the second primary assembling piece 232, wherein the end of the second primary assembling piece 232 is joined to the end of the first primary assembling piece 231 by means of for example screwing, fastening, or welding, to have the end of the second primary assembling piece 232 connected to the end of the first primary assembling piece 231.

Figure 7:
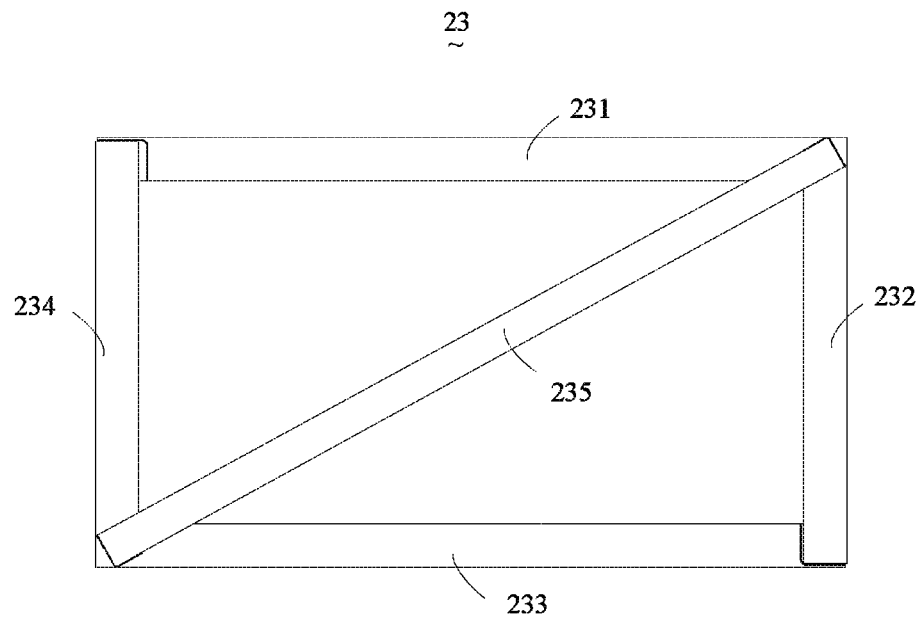
FIG. 7 is a schematic view showing a diagonally-arranged first secondary assembling piece mounted to a main frame structure of a flat panel display device according to a sixth embodiment of the present invention.

Referring to FIG. 7, FIG. 7 is a schematic view showing a diagonally-arranged first secondary assembling piece mounted to a main frame structure of a flat panel display device according to a sixth embodiment of the present invention. In the instant embodiment, the first secondary assembling piece 235 and the second secondary assembling piece 236 are arranged in the main frame structure 27 of the back frame 23. An end of the first secondary assembling piece 235 is joined to the first primary assembling piece 231 and another end of the first secondary assembling piece 235 is joined to the third primary assembling piece 233; and an end of the second secondary assembling piece 236 is joined to the first primary assembling piece 231 and another end of the second secondary assembling piece 236 is joined to the third primary assembling piece 233. Further, the second primary assembling piece 232, the fourth primary assembling piece 234, the first secondary assembling piece 235, and the second secondary assembling piece 236 are arranged parallel to each other. In other embodiments, those skilled in the art may arrange at least one secondary assembling piece in the main frame structure 27. For example, only the first secondary assembling piece 235 is arranged in the main frame structure 27. Further, the two ends of the first secondary assembling piece 235 can be selectively joined to at least two of the primary assembling pieces of the first primary assembling piece 231, the second primary assembling piece 232, the third primary assembling piece 233, and the fourth primary assembling piece 234. For example, the first secondary assembling piece 235 is set diagonally in the main frame structure 27, as shown in FIG. 7. Similarly, the two ends of the second secondary assembling piece 236 can be selectively joined to at least two of the primary assembling pieces of the first primary assembling piece 231, the second primary assembling piece 232, the third primary assembling piece 233, and the fourth primary assembling piece 234.

Figure 8:
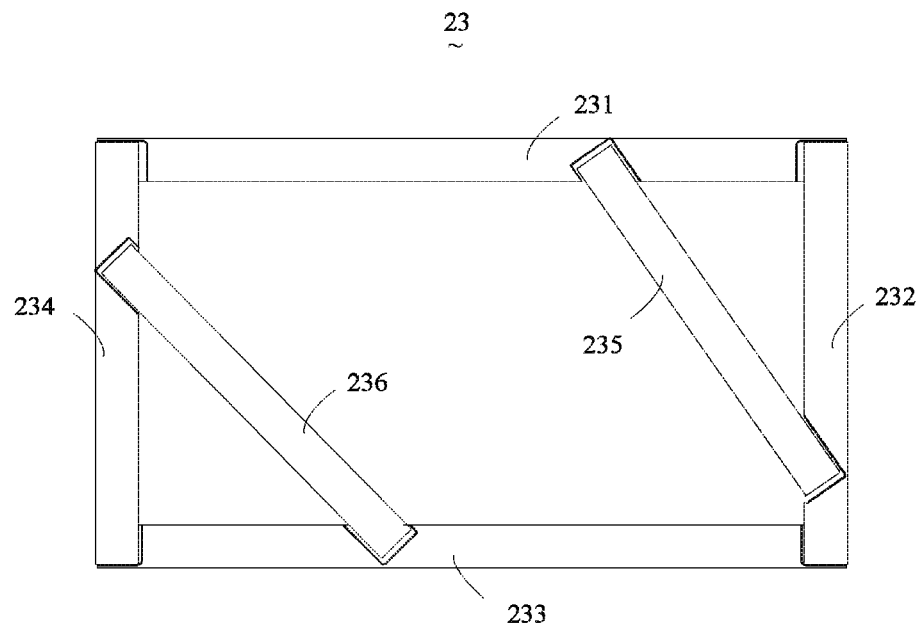
FIG. 8 is a schematic view showing a first secondary assembling piece and a second secondary assembling piece mounted to a main frame structure of a flat panel display device according to a seventh embodiment of the present invention.

Referring to FIG. 8, FIG. 8 is a schematic view showing a first secondary assembling piece and a second secondary assembling piece mounted to a main frame structure of a flat panel display device according to a seventh embodiment of the present invention. For example, the two ends of the first secondary assembling piece 235 are respectively joined to the first primary assembling piece 231 and the second primary assembling piece 232 that are adjacent to each other and the two ends of the second secondary assembling piece 236 are respectively joined the third primary assembling piece 233 and the fourth primary assembling piece 234 that are adjacent to each other.

In the instant embodiment, the back frame 23 comprises seven bracing pieces 2371, 2372, 2373, 2374, 2375, 2376, and 2377. The bracing piece 2371 is fixed to the fourth primary assembling piece 234; the bracing pieces 2372, 2373 are both fixed to the first secondary assembling piece 235; the bracing piece 2374 is fixed to the second secondary assembling piece 236; the bracing piece 2375 is fixed to the second primary assembling piece 232; and the bracing pieces 2376, 2377 are each fixed, at two ends thereof, to the first secondary assembling piece 235 and the second secondary assembling piece 236. In practice, the bracing pieces can be fixed to one or more of the first primary assembling piece 231, the second primary assembling piece 232, the third primary assembling piece 233, the fourth primary assembling piece 234, the first secondary assembling piece 235, and the second secondary assembling piece 236. In other embodiments, those skilled in the art may mount bracing pieces of any other numbers to the back frame 23, such as one or more bracing pieces. Further, the bracing pieces can be releasably fixed to one or more of the first primary assembling piece 231, the second primary assembling piece 232, the third primary assembling piece 233, the fourth primary assembling piece 234, the first secondary assembling piece 235, and the second secondary assembling piece 236.

The bracing pieces 2371, 2372, 2373, 2374, 2375, 2376, and 2377 may be provided with bumps (not labeled) so that the back frame 23 may fix components, such as circuit boards, with such bumps.

Molds for making the back frame 23 will be described. In the instant embodiment, the first primary assembling piece 231 and the third primary assembling piece 233 are of the same size and shape so that they can be made by stamping with the same mold. The second primary assembling piece 232, the fourth primary assembling piece 234, the first secondary assembling piece 235, and the second secondary assembling piece 236 are of the same size and shape so that they can be made by stamping with the same mold, making it possible to share the mold. Thus, the back frame 23 of the present invention can be made by stamping with only two small-sized molds, and compared to the conventional back frame 10 that requires a large-sized mold, the molds for making the back frame 23 of the present invention are simple in structure and small in size and thus the cost of mold for the back frame 23 can be lowered. Further, compared to the whole back frame structure of the conventional back frame 10, the back frame 23 of the present invention can significantly save material used and thus reduce the manufacturing cost of the flat panel display device 20.

Figure 9:
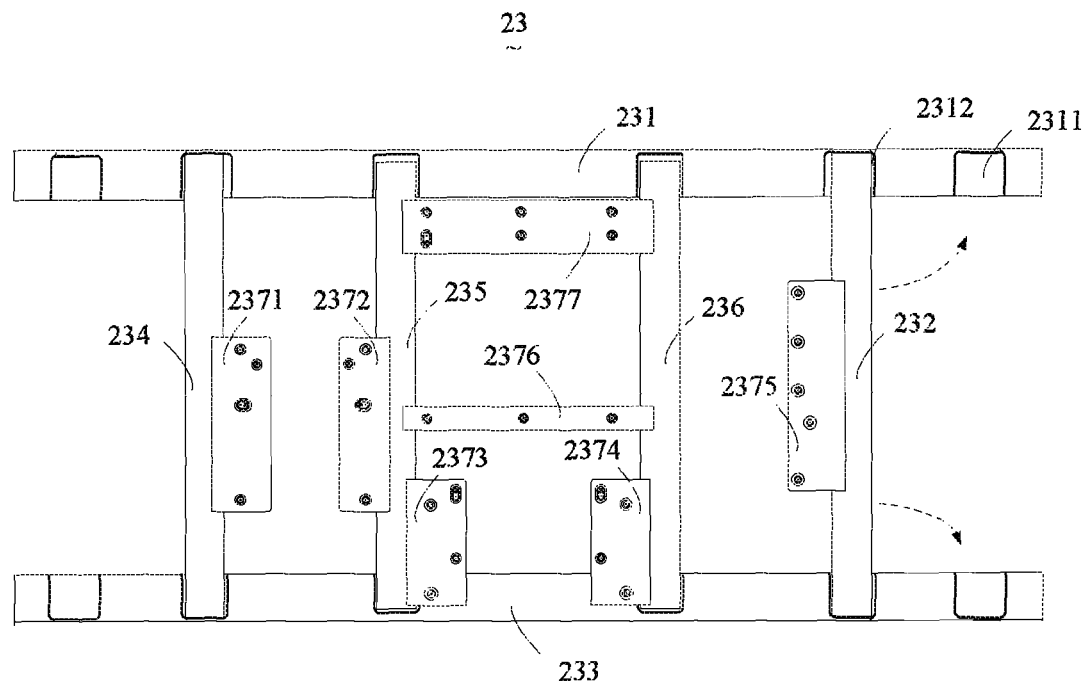
FIG. 9 is a schematic view showing joint sections of a back frame of a flat panel display device according to an eighth embodiment of the present invention.

Referring to FIG. 9, FIG. 9 is a schematic view showing joint sections of a back frame of a flat panel display device according to an eighth embodiment of the present invention. As shown in FIG. 9, in the instant embodiment, an end of the first primary assembling piece is provided with two joint sections, and the joint sections have a structure mating an end of the second primary assembling piece so that the first primary assembling piece can be joined to a corresponding end of the second primary assembling piece.

Specifically, the first primary assembling piece 231 has an end having a surface forming joint sections 2311, 2312, and the joint sections 2311, 2312 are arranged in a spaced manner in a lengthwise direction of the first primary assembling piece 231. The joint sections 2311, 2312 are formed by forming recesses having a shape mating an end of the second primary assembling piece 232 in the first primary assembling piece 231 in order to receive the end of the second primary assembling piece 232 therein.

Figure 10:
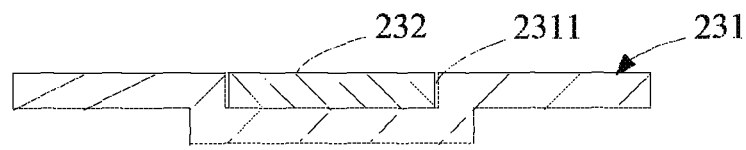
FIG. 10 is a cross-sectional view showing a first example of joint section of FIG. 9.

Referring to FIG. 10, FIG. 10 is a cross-sectional view showing a first example of joint section of FIG. 9. As shown in FIG. 10, the joint sections 2311, 2312 are recesses that do not extend through opposite surfaces of the end of the first primary assembling piece 231 and the recesses are of a rectangular shape with the second primary assembling piece 232 being straight linear.

To assemble a large-sized back frame 23, the joint section 2311 that is close to the very end of the first primary assembling piece 231 is first taken and a second primary assembling piece 232 having a corresponding width is selected. Afterwards, an end of the second primary assembling piece 232 is positioned in the recess of the joint section 2311. And then, means, such as screwing, fastening, or welding, is applied to join and fix the end of the second primary assembling piece 232 to the joint section 2311. To assemble a small-sized back frame 23, the joint section 2312 that is distant from the very end of the first primary assembling piece 231 is first chosen and a second primary assembling piece 232 having a corresponding width is selected. Afterwards, an end of the second primary assembling piece 232 is positioned in the recess of the joint section 2312. And then, means, such as screwing, fastening, or welding, is applied to join and fix the end of the second primary assembling piece 232 to the joint section 2312.

Figure 11:
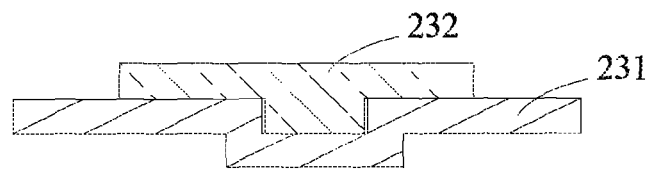
FIG. 11 is a schematic view showing a joining structure of a joint section of a back frame of a flat panel display device according to a ninth embodiment of the present invention.

Referring to FIG. 11, FIG. 11 is a schematic view showing a joining structure of a joint section of a back frame of a flat panel display device according to a ninth embodiment of the present invention. As shown in FIG. 11, to allow of selection of the size of the back frame 23 in another direction, for example the second primary assembling piece 232 forms a protrusion at a corresponding location on a surface thereof, and the protrusion of the second primary assembling piece 232 is embedded in the recess the first primary assembling piece 231 at a corresponding location in order to join the first primary assembling piece 231 and the second primary assembling piece 232. Further, the second primary assembling piece 232 may form, on a surface of one end thereof, at least two protrusions that are spaced in the lengthwise direction of the second primary assembling piece 232, such as two, three, or four protrusions.

Figure 12:
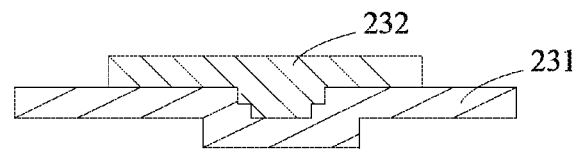
FIG. 12 is a schematic view showing a joining structure of a joint section of a back frame of a flat panel display device according to a tenth embodiment of the present invention.

Furthermore, as shown in FIG. 12, FIG. 12 is a schematic view showing a joining structure of a joint section of a back frame of a flat panel display device according to a tenth embodiment of the present invention. The recess of the first primary assembling piece 231 can be a recess of a multi-stepped configuration and the second primary assembling piece 232 forms, at a corresponding location, a protrusion having a multi-stepped configuration corresponding to the recess.

Figure 13:
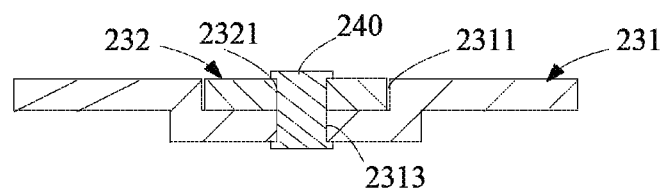
FIG. 13 is a schematic view showing a joining structure of a joint section of a back frame of a flat panel display device according to an eleventh embodiment of the present invention.

Further, as shown in FIG. 13, FIG. 13 is a schematic view showing a joining structure of a joint section of a back frame of a flat panel display device according to an eleventh embodiment of the present invention. Taking the joint section 2311 as an example, the recess of the first primary assembling piece 231 forms, in a bottom thereof, a first through hole 2313, and the second primary assembling piece 232 forms, at a location corresponding to the joint section 2311, a second through hole 2321. The back frame 23 further comprises a fastener 240. The fastener 240 extends through the first through hole 2313 and the second through hole 2321 to joint the first primary assembling piece 231 and the second primary assembling piece 232 to each other.

Figure 14:
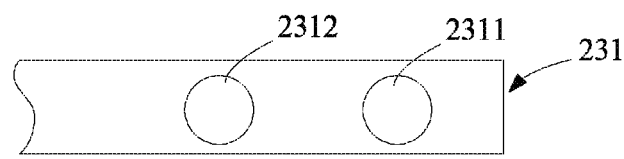
FIG. 14 is a schematic view showing a joint section of a back frame of a flat panel display device according to a twelfth embodiment of the present invention.

As shown in FIG. 14, FIG. 14 is a schematic view showing a joint section of a back frame of a flat panel display device according to a twelfth embodiment of the present invention. The recesses of the joint sections 2311, 2312 of the first primary assembling piece 231 are of a circular shape. Yet, in other embodiments, those skilled in the art may arrange the shape of the recesses to be other polygonal configurations, such as triangle.

Figure 15:
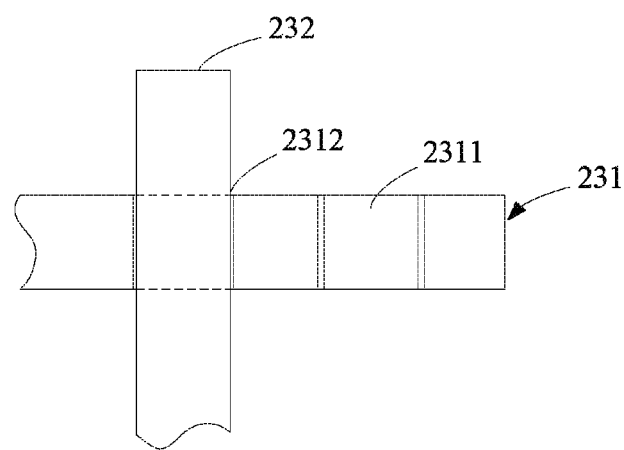
FIG. 15 is a schematic view showing a joint section of a back frame of a flat panel display device according to a thirteenth embodiment of the present invention.

As shown in FIG. 15, FIG. 15 is a schematic view showing joining realized by using different joint sections of a back frame of a flat panel display device according to a thirteenth embodiment of the present invention. In another embodiment of the back frame of flat panel display device according to the present invention, the joint sections 2311, 2312 are recesses that extend through opposite surfaces of the first primary assembling piece 231, whereby an end of the second primary assembling piece 232 is movable within the joint sections 2311, 2312. For example, after the end of the second primary assembling piece 232 is set extending beyond and joined and fixed to the joint section 2312, the portion of extension is then trimmed off so that the length of the second primary assembling piece 232 that serves as a primary assembling piece of the back frame can be adjusted and thus back frames of different sizes can be obtained.

In a practical application, the other end of the first primary assembling piece 231 and both ends of the third primary assembling piece 233 are all provided with two joint sections having a structure identical to that of the joint sections 2311, 2312. The ends of the second primary assembling piece 232 and the ends of the fourth primary assembling piece 234 may be subjected to specific designs or no design at all according to different applications. For example:

(1) In a first situation, as shown in FIG. 10, the two ends of the second primary assembling piece 232 and the two ends of the fourth primary assembling piece 234 are of no specific design. In other words, the ends are of the same structure as the remaining portions. Under this condition, in making a join with a selected joint section 2311 (2312) at one end of the first primary assembling piece 231 (the same applicable to the other end), if an attempt is made to change the width of the back frame 23, then the length of the corresponding second primary assembling piece 232 and fourth primary assembling piece 234 must be selected accordingly. Namely, if the joint section 2311 that is close to the very end of the first primary assembling piece 231 is selected for joining, then no trimming is applied to the second primary assembling piece 232 and the fourth primary assembling piece 234 or the portion that is trimmed off is short; if the joint section 2312 that is distant from the very end of the first primary assembling piece 231 is selected for joining, then the second primary assembling piece 232 and the fourth primary assembling piece 234 are trimmed and the trimmed portion being long or short is according to the distance that the joint section is from the very end of the first primary assembling piece 231 being great or small; and (2) In a second situation, it is similar to the first situation, but as shown in FIG. 11, the second primary assembling piece 232 and the fourth primary assembling piece 234 use different protrusions to respectively mate the first primary assembling piece 231 and the third primary assembling piece 233 in order to realize change of width of the back frame 23; similarly, if a joint section 2312 other than the first joint section 2311 that is close to the very end of the first primary assembling piece 231 is selected for joining, then before or after joining, excessive portions of the second primary assembling piece 232 and the fourth primary assembling piece 234 may be trimmed off.

This also applicable to an embodiment of the main frame structure 27 of the back frame 23 that is formed by only joining two L-shaped primary assembling pieces.

In summary, the present invention provides a back frame 23 having a first primary assembling piece that is provided with at least two joint sections. The number of the joint section can be selected according to the requirement of customers. In the instant embodiment, a description is given to an example comprising two joint sections 2311, 2312. Thus, to prepare the molds for making the back frame 23, only two sets of mold are needed, namely one mold for a first primary assembling piece and the other mold for a second primary assembling piece. The first primary assembling piece may be provided with a plurality of joint sections for joining operation in order to form various sizes for the back frame 23. To assemble the back frame 23, based on the desired size of the back frame 23, the corresponding one of the joint sections is selected. With the joint section, the second primary assembling piece is joined to the joint section of the first primary assembling piece and the other joint section of the first primary assembling piece that is located outward of the joining location of the second primary assembling piece is trimmed off to obtain a desired size of the back frame 23. Compared to the conventional technology that requires different back frame molds for making different sizes of back frame 10, the back frame of the flat panel display device 23 according to the present invention requires only a mold for the first primary assembling piece and a mold for the second primary assembling piece 28 so that mold sharing among various sizes of product can be realized and the molds used are of simple structures, allowing of reduction of expenditure of the molds for back frames.

The present invention also provides a mold for making a back frame of flat panel display device. The back frame mold is provided with a main pattern for forming a primary assembling piece of the back frame and the main pattern comprises a sub-pattern that forms at least two joint sections on an end of the primary assembling piece. The primary assembling piece comprises the previously discussed first primary assembling piece and second primary assembling piece, corresponding to the above mentioned main pattern; and the joint section comprises the previously discussed joint section of the first primary assembling piece, corresponding to the above mentioned sub-pattern. Repeated description is omitted herein.

Figure 16:
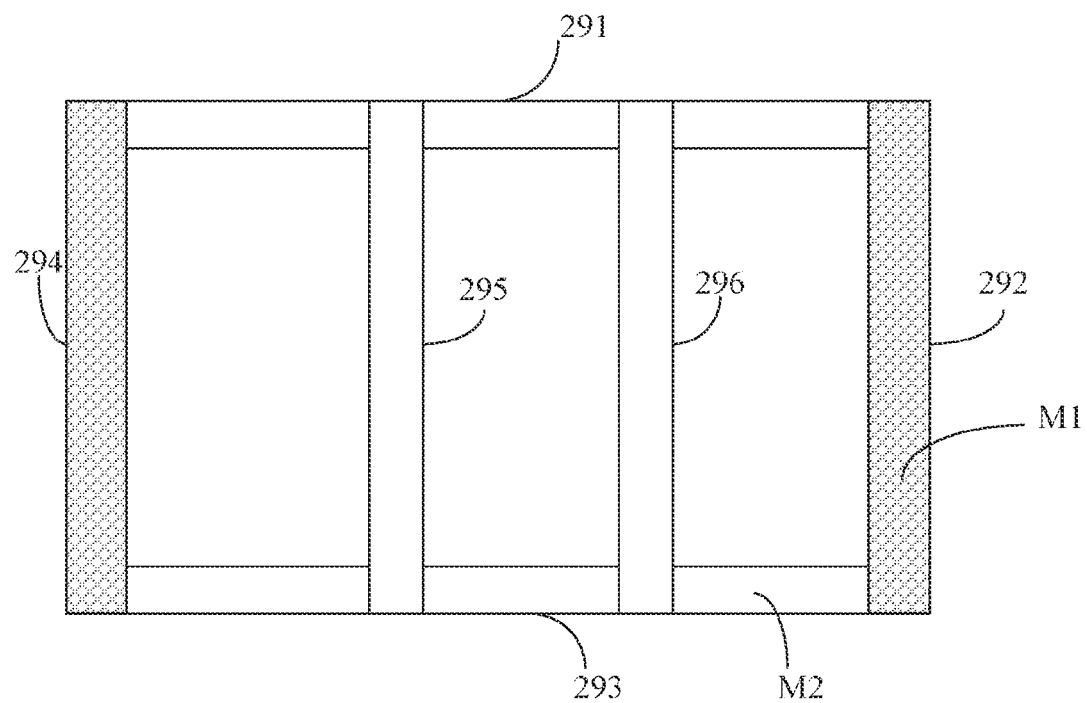
FIG. 16 is a schematic view showing a back frame of a flat panel display device according to a fourteenth embodiment of the present invention.
Figure 17:
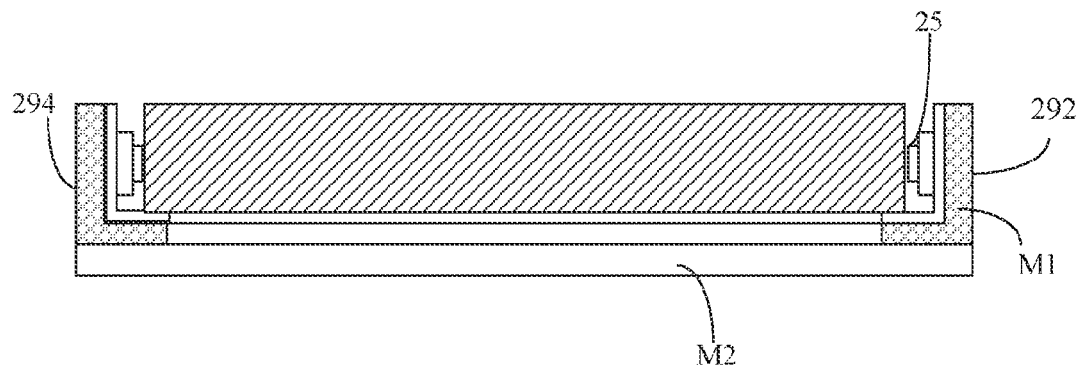
FIG. 17 is a schematic view showing a flat panel display device according to a fifteenth embodiment of the present invention.

Referring to FIGS. 16-17, FIG. 16 is a schematic view showing a back frame of a flat panel display device according to a fourteenth embodiment of the present invention and FIG. 17 is a schematic view showing a flat panel display device according to a fifteenth embodiment of the present invention. An example of four primary assembling pieces and two secondary assembling pieces will be given to describe the difference in material section for the primary assembling piece of the back frame 23 of the flat panel display device 20 according to the present invention having a heat source arranged thereon and the assembling piece having no heat source arranged thereon.

In the four primary assembling pieces and the two secondary assembling pieces, at least two primary assembling pieces comprise the primary assembling piece that has a heat source arranged thereon. The primary assembling piece that has the heat source arranged thereon has a first heat transfer capability. The remaining one or more primary assembling pieces of the at least two primary assembling pieces that have no heat source arranged thereon have a second heat transfer capability. The first heat transfer capability is greater than the second heat transfer capability.

The heat source can be a light-emitting diode (LED), a printed circuit board (PCB), or other electronic devices that generate heat. LED is taken an example here. A parameter that represents the heat transfer capability can be thermal conductivity. In other words, the primary assembling piece that has a heat source arranged thereon has a thermal conductivity that is greater than the thermal conductivity of the remaining one or more primary assembling pieces that have no heat source arranged thereon.

The primary assembling piece that has a heat source arranged thereon has a first strength. The remaining one or more primary assembling pieces of the at least two primary assembling pieces that have no heat source arranged thereon have a second strength. The second strength is greater than the first strength.

The primary assembling piece that has the first heat transfer capability and the first strength is an aluminum piece and the primary assembling pieces that have the second heat transfer capability and the second strength are galvanized steel pieces. Certainly, besides aluminum pieces, other pieces having a better capacity of heat dissipation can be copper pieces, magnesium alloys, or open aluminum alloy foams. Besides galvanized steel pieces, pieces having a better strength can be organic pieces or tinned iron piece.

An example of back frame that comprises four primary assembling pieces and two secondary assembling pieces will be given as follow. As shown in FIGS. 16-17, a first primary assembling piece 291, a second primary assembling piece 292, a third primary assembling piece 293, a fourth primary assembling piece 294, a first secondary assembling piece 295, and a second secondary assembling piece 296 constitute a back frame. The primary assembling pieces that have a heat source 25 arranged thereon are the second primary assembling piece 292 and the fourth primary assembling piece 294. The second primary assembling piece 292 and the fourth primary assembling piece 294 are made of aluminum pieces M1. The first primary assembling piece 291, the third primary assembling piece 293, the first secondary assembling piece 295, and the second secondary assembling piece 296 are made of galvanized steel pieces M2.

Further, the primary assembling piece that has a heat source arranged thereon can be a stacked structure of a first layer and a second layer, of which the first layer is adjacent to the heat source and the first layer has a heat transfer capability that is greater than heat transfer capability of the second layer.

The first layer is adjacent to the heat source and the material of the first layer can be selected to have a heat transfer capability greater than the heat transfer capability of the material of the second layer. For example, the first layer is an aluminum piece, or a copper piece, or magnesium alloys, or open aluminum alloy foams, and the second layer is an organic piece or tinned iron. Certainly, the primary assembling piece that carries the heat source 25 can be of a single layer having a material used to make the first layer mentioned above.

Aluminum pieces and copper pieces have better performance of heat dissipation and are advantageous in extending lifespan of product. Galvanized steel has worse performance of heat dissipation, but the price is relatively low and strength is better. In the cost of a back frame, the material cost takes the greatest percentage. If the whole back frame is made of a material that has a better performance of heat dissipation, such as aluminum, then the cost is extremely high and the structural strength is poor. If it is completely made of a material having poor performance of heat dissipation, such as galvanized steel, then the heat dissipation will be poor and the product performance will be deteriorated. Thus, in practical applications, different parts must be manufactured with different materials according to the requirement in order to minimize the product cost and at the same time ensure the requirements of heat dissipation and strength are satisfied, so that the material cost can be reduced and the product cost is lowered. Certainly, the above embodiments of different material selection for the primary assembling pieces are also applicable to a main frame structure that is formed by joining two L-shaped primary assembling pieces.

Besides using different materials for different parts at different locations of the back frame in order to reduce cost, the present invention provides a bracing piece on the back frame for fixing a circuit board. The bracing piece comprises a bracing body, a first suspension section, a first bearing section, and a first resilient bent section.

Figure 18:
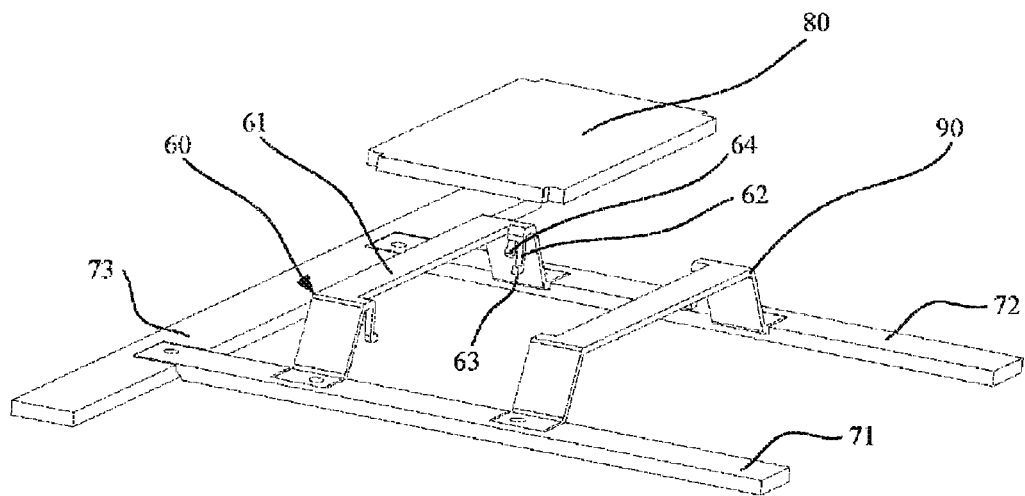
FIG. 18 is a schematic view showing a portion of a back frame of a flat panel display device according to a sixteenth embodiment of the present invention.
Figure 19:
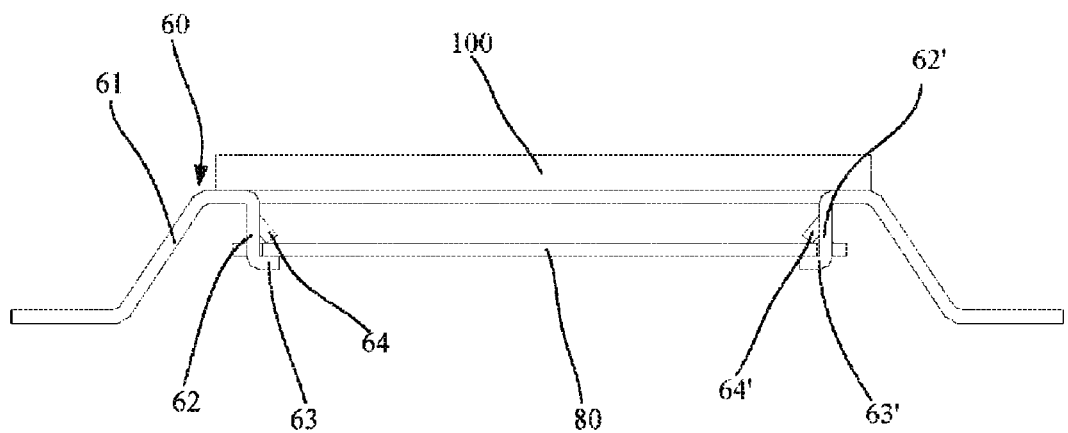
FIG. 19 is a cross-sectional view showing a bracing piece of the back frame of FIG. 18 and a circuit board.

Referring to FIGS. 18 and 19, FIG. 18 is a schematic view showing a portion of a back frame of a flat panel display device according to a sixteenth embodiment of the present invention and FIG. 19 is a cross-sectional view showing a bracing piece of the back frame of FIG. 18 and a circuit board. Assembling pieces 71, 72, and 73 are the various assembling pieces described in the above discussed embodiments, including the primary assembling pieces that are joined to form a main frame structure or the secondary assembling pieces that are arranged inside the main frame structure and joined to the main frame structure. A bracing piece 60 comprises a bracing body 61, a first suspension section, a first bearing section 63, and a first resilient bent section 64. The bracing body 61 is fixed to the assembling pieces 71 and 72. In the instant embodiment, the bracing body 61 is of a step-like configuration and bridges between the two assembling pieces 71, 72. However, in backup embodiments of the present invention, the bracing body 61 can be of a straight bar like configuration or other shapes. Further, the bracing body 61 can be fixed to the assembling piece with only one end thereof, while the other end is arranged in a suspending form to simplify mounting process.

The first suspension section 62 extends from the bracing body 61 toward one side of the bracing body 61. The first bearing section 63 is spaced from the bracing body 61 and extends from the first suspension section 62 toward one side of the first suspension section 62. The first resilient bent section 64 is located between the first bearing section 62 and the bracing body 61 and is bent from the first suspension section 63 toward one side of the first suspension section 62. The first bearing section 63 and the first resilient bent section 64 resiliently clamp a first side edge of a circuit board 80.

Referring to FIG. 19, the bracing piece 60 further comprises a second suspension section 62', a second bearing section 63', and a second resilient bent section 64'. The second suspension section 62' is spaced from the first suspension section 62 and extends from the bracing body 61 toward one side of the bracing body 61. The second bearing section 63' is spaced from the bracing body 61 and extends from the second suspension section 62' toward one side of the second suspension section 62'. The second resilient bent section 64' is located between the second bearing section 63' and the bracing body 61 and the bracing body 61 and is bent from the second suspension section 62' toward one side of the second suspension section 62'. The second bearing section 63' and the second resilient bent section 64' resiliently clamp a second side edge of the circuit board 80 that is opposite to the first side edge. In a preferred embodiment, the first suspension section 62, the first bearing section 63, and the first resilient bent section 64 and the second suspension section 62', the second bearing section 63', and the second resilient bent section 64' are symmetric with respect to a center line of the bracing body 61. In a backup embodiment of the present invention, the bracing body 61 of the bracing piece 60 may comprise only the first suspension section 62, the first bearing section 63, and the first resilient bent section 64 for only resiliently clamping the first side edge of the circuit board 80, and an additional bracing piece that is identical to the bracing piece 60 is provided to resiliently clamp the second side edge of the circuit board 80.

Referring to FIG. 19, after the circuit board 80 is mounted, an electromagnetic shielding piece 100 is set on the bracing body 61. The electromagnetic shielding piece 100 is spaced from the circuit board 80 to shield electromagnetic signals generated by the circuit board 80. The electromagnetic shielding piece 100 can be a Faraday cage or a metal plate.

Referring to FIG. 18, in the instant embodiment, a bracing piece 90 that is identical in structure to the bracing piece 60 is further provided. The bracing piece 90 is spaced from the bracing piece 60 to clamp different locations of the first and second side edges of the circuit board 80.

In the instant embodiment, a bracing piece is arranged on the assembling piece to fix the circuit board so that the problem that a circuit board cannot be easily fixed is overcome.

In summary, the present invention provides another back frame of flat panel display device. Referring to FIG. 20, FIG. 20 is a schematic view showing a back frame of flat panel display device according to a seventeenth embodiment of the present invention. A main frame structure of the back frame is formed by joining, in a leading end-to-tailing end manner, a first primary assembling piece 301, a second primary assembling piece 302, a third primary assembling piece 303, and a fourth primary assembling piece 304. A first secondary assembling piece 305 and a second secondary assembling piece 306 have two ends that are respectively joined to the first primary assembling piece 301 and the third primary assembling piece 303. The back frame comprises the second primary assembling piece 302 and the fourth primary assembling piece 304 that have a heat source arranged thereon. The second primary assembling piece 302 and the fourth primary assembling piece 304 that have a heat source arranged thereon have a first heat transfer capability, while the remaining first primary assembling piece 301 and third primary assembling piece 303 having no heat source arranged thereon have a second heat transfer capability. The first heat transfer capability is greater than the second heat transfer capability. The bracing piece 307 (as shown in FIGS. 18 and 19) comprises a bracing body, a first suspension section, a first bearing section, and a first resilient bent section. The bracing body is fixed to the second primary assembling piece 302 and the second secondary assembling piece 306. The first suspension section extends from the bracing body toward one side of the bracing body. The first bearing section is spaced from the bracing body and extends from the first suspension section toward one side of the first suspension section. The first resilient bent section is located between the first bearing section and the bracing body and is bent from the first suspension section toward one side of the first suspension section. The first bearing section and the first resilient bent section resiliently clamp a first side edge of the circuit board.

The back frame of the instant embodiment can be a joined back frame as described in any of the previous embodiment. With the bracing piece described above mounted to the assembling pieces of the back frame, the problem that a circuit board cannot be easily fixed can be overcome. Further, using different materials for different parts according the practical needs helps reducing the material cost and also improving the strength of a joining site of the back frame.

The present invention also provides a method for making a back frame of flat panel display device, as shown in FIG. 21. FIG. 21 is a flow chart showing a method for manufacturing a back frame of a flat panel display device according to an eighteenth embodiment of the present invention. The method comprises the following steps:

Step 501: manufacturing at least two primary assembling pieces, the at least two primary assembling pieces comprising a primary assembling piece that carries a heat source. The primary assembling piece that carries the heat source has a first heat transfer capability, and the remaining one or more primary assembling pieces of the at least two primary assembling pieces that carry no heat source have a second heat transfer capability, the first heat transfer capability being greater than the second heat transfer capability; and Step 502: joining the at least two primary assembling pieces to form a main frame structure of the back frame, a bracing piece being mounted to the back frame for fixing a circuit board.

In the instant embodiment, when other joint sections are present between the joining location of the second primary assembling piece and the end of the first primary assembling piece, before or after the step of selecting one joint section of the at least two joint sections according to a size of the back frame to join the corresponding end of the second primary assembling piece, the other joint sections of the first primary assembling piece that are located outward of the joining position of the second primary assembling piece are trimmed off. The first primary assembling piece comprises the previously discussed first primary assembling piece, and the second primary assembling piece comprises the previously discussed second primary assembling piece, and repeated description will be omitted herein.

Figure 22:
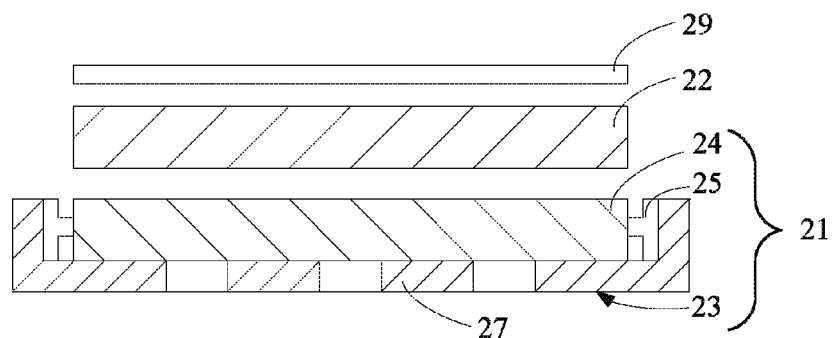
FIG. 22 is a schematic view showing a flat panel display device with a touch screen according to a nineteenth embodiment of the present invention.

FIG. 22 is a schematic view showing a flat panel display device with a touch screen according to a nineteenth embodiment of the present invention. As shown in FIG. 22, the flat panel display device 20 of the present invention further comprises a touch screen 29. The touch screen 29 is arranged on a light exit surface of the display panel 22 of the flat panel display device 20. The flat panel display device 20 comprises: the backlight system 21 and the above discussed display panel 22. The backlight system 21 is arranged at the back side of the display panel 22 and supplies light to the display panel 22.

The backlight system 21 comprises a light source 25, a light homogenization mechanism 24, and a back frame 23. The back frame 23 carries the light source 25 and the light homogenization mechanism 24. When the backlight system 21 is an edge lighting type, the light homogenization mechanism 24 is a light guide; and when the backlight system 21 is a direct type, the light homogenization mechanism 24 is a diffuser plate. The back frame 23 comprises at least a first primary assembling piece and a second primary assembling piece, and the at least one first and second primary assembling pieces constitute a main frame structure 27 of the back frame 23.

It is noted that the flat panel display device 20 of the present invention can be a liquid crystal display device or a liquid crystal television.

Figure 23:
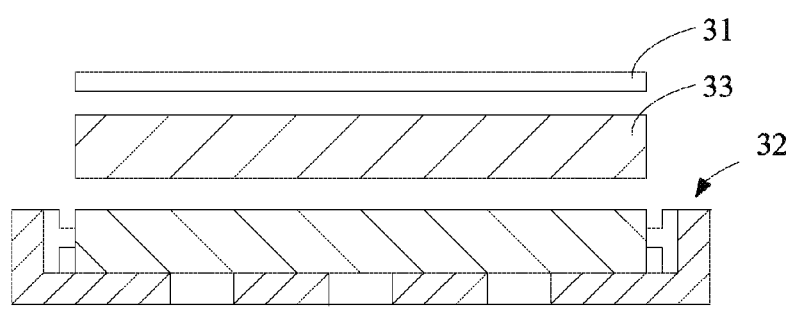
FIG. 23 is a schematic view showing a stereoscopic display device according to a twentieth embodiment of the present invention.

The present invention also provides a stereoscopic display device 30, as shown in FIG. 23. FIG. 23 is a schematic view showing a stereoscopic display device according to a twentieth embodiment of the present invention. The stereoscopic display device 30 comprises a liquid crystal lens grating 31, a backlight system 32, and a display panel 33. The liquid crystal lens grating 31 is arranged on a light exit surface of the display panel 33. The backlight system 32 can be a backlight system of any one of the above discussed embodiments, such as the backlight system 32 comprising a light source (not shown), a light homogenization mechanism, and the back frame 23. The back frame 23 carries the light source and the light homogenization mechanism and light homogenization mechanism guides light from the light source to the display panel 33. The back frame 23 comprises at least first primary assembling piece and the second primary assembling piece. The at least first and second primary assembling pieces form a main frame structure of the back frame. Repeated description will be omitted herein.

Figure 24:
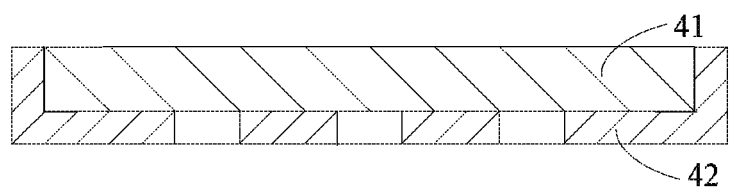
FIG. 24 is a schematic view showing a plasma display device according to a twenty-first embodiment of the present invention.

The present invention also provides a plasma display device 40, as shown in FIG. 24. FIG. 24 is a schematic view showing a plasma display device according to a twenty-second embodiment of the present invention. The plasma display device 40 comprises a plasma display panel 41 and a back frame 42. The back frame 42 is arranged at a back side of the display panel 41. The back frame 42 can be the back frame of any one of the previously discussed embodiments and repeated description will be omitted herein.

With the above discussed manners, the present invention provides a flat panel display device, a stereoscopic display device, and a plasma display device that have a mold for back frame that is of a simple structure, reduce the expenditure for mold of back frame, and also save the material used for back frame so as to lower down the cost of flat panel display device.

Embodiments of the present invention have been described, but are not intending to impose any undue constraint to the appended claims of the present invention. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A flat panel display device, wherein the flat panel display device comprises a backlight system and a display panel, wherein:

the backlight system comprises a light source, a light homogenization mechanism, and a back frame;

the back frame carries the light source and the light homogenization mechanism, the light homogenization mechanism guiding light from the light source into the display panel;

the back frame comprises at least two primary assembling pieces and also comprises secondary assembling pieces and a bracing piece for fixing a circuit board;

the at least two primary assembling pieces being connected through joining to form a main frame structure of the back frame, the secondary assembling pieces being joined to the primary assembling pieces;

the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; and the bracing piece is provided for fixing a circuit board, the bracing piece comprising a bracing body, a first suspension section, a first bearing section, and a first resilient bent section, the bracing body being fixed to the primary assembling pieces or the secondary assembling pieces or both of the primary assembling pieces and the secondary assembling pieces, the first suspension section extending from the bracing body toward one side of the bracing body, the first bearing section being spaced from the bracing body and extending from the first suspension section toward one side of the first suspension section, the first resilient bent section being located between the first bearing section and the bracing body and being bent from the first suspension section toward one side of the first suspension section, the first bearing section and the first resilient bent section resiliently clamping a first side edge of the circuit board.

2. The flat panel display device as claimed in claim 1, wherein:

the primary assembling piece that has the heat source arranged thereon has a first strength, the remaining one or more primary assembling pieces of the at least two primary assembling pieces that have no heat source arranged thereon having a second strength, the second strength being greater than the first strength.

3. The flat panel display device as claimed in claim 2, wherein:

the primary assembling piece that has the first heat transfer capability and the first strength is an aluminum piece and the primary assembling pieces that have the second heat transfer capability and the second strength are galvanized steel pieces.

4. The flat panel display device as claimed in claim 1, wherein the bracing piece further comprises a second suspension section, a second bearing section, and a second resilient bent section, the second suspension section being spaced from the first suspension section and extending from the bracing body toward one side of the bracing body, the second bearing section being spaced from the bracing body and extending from the second suspension section toward one side of the second suspension section, the second resilient bent section being located between the second bearing section and the bracing body and extending from the second suspension toward one side of the second suspension section, the second bearing section and the second resilient bent section resiliently clamping a second side edge of the circuit board that is opposite to the first side edge.

5. The flat panel display device as claimed in claim 1, wherein the back frame comprises two bracing pieces and the two bracing pieces are spaced from each other to clamp different locations of the first side edge and the second side edge of the circuit board, the bracing body being of step-like configuration and bridging between the two assembling pieces.

6. The flat panel display device as claimed in claim 1, wherein:

the at least two primary assembling pieces comprise a first primary assembling piece and a second primary assembling piece that are joined to each other, wherein the first primary assembling piece has an end having a surface forming at least joint sections that are arranged to space from each other in a lengthwise direction of the first primary assembling piece, the first primary assembling piece using one of the joint sections thereof to join a corresponding end of the second primary assembling piece in order to form a main frame structure of the back frame having different sizes.

7. The flat panel display device as claimed in claim 6, wherein:
the joint sections comprise recesses formed in a surface of the first primary assembling piece and having a shape corresponding to the end of the second primary assembling piece for receiving the end of the second primary assembling piece.

8. The flat panel display device as claimed in claim 6, wherein:
the joint sections comprise recesses formed in the surface of the first primary assembling piece, the second primary assembling piece having an end having a surface forming protrusions at corresponding positions that are arranged to space from each other in a lengthwise direction of the second primary assembling piece, the protrusions being receivable in the recesses to join the first primary assembling piece and the second primary assembling piece to each other.

9. The flat panel display device as claimed in claim 6, wherein:
the back frame comprises a third primary assembling piece and a fourth primary assembling piece; and
the first primary assembling piece, the second primary assembling piece, the third primary assembling piece, and the fourth primary assembling piece are connected to each other in a leading end-to-tailing end manner through screwing, fastening or welding to form a rectangular main frame structure of the back frame.

10. The flat panel display device as claimed in claim 9, wherein:
the secondary assembling pieces comprise a first secondary assembling piece and a second secondary assembling piece, the first secondary assembling piece having two ends respectively joined to at least two primary assembling pieces of the first primary assembling piece, the second primary assembling piece, the third primary assembling piece, and the fourth primary assembling piece, the second secondary assembling piece having two ends respectively joined to at least two primary assembling pieces of the first primary assembling piece, the second primary assembling piece, the third primary assembling piece, and the fourth primary assembling piece.

11. The flat panel display device as claimed in claim 10, wherein:
the two ends of the first secondary assembling piece are respectively joined to the first primary assembling piece and the second primary assembling piece that are adjacent to each other and the two ends of the second secondary assembling piece are respectively joined to the third primary assembling piece and the fourth primary assembling piece that are adjacent to each other; or the two ends of the first secondary assembling piece are respectively joined to the first primary assembling piece and the third primary assembling piece that are opposite to each other and the two ends of the second secondary assembling piece are respectively joined to the first primary assembling piece and the third primary assembling piece that are opposite to each other.

12. The flat panel display device as claimed in claim 1, wherein the flat panel display device comprises a touch screen, the touch screen being positioned on a light exit surface of the display panel.

13. A stereoscopic display device, wherein:
the stereoscopic display device comprises a liquid crystal lens grating, a backlight system, and a display panel, the liquid crystal lens grating being arranged on a light exit surface of the display panel;
the backlight system comprises a light source, a light homogenization mechanism, and a back frame;
the back frame carries the light source and the light homogenization mechanism, the light homogenization mechanism guiding light from the light source to a light incidence surface of the display panel;
the back frame comprises at least two primary assembling pieces and also comprises secondary assembling pieces and a bracing piece for fixing a circuit board;
the at least two primary assembling pieces being connected through joining to form a main frame structure of the back frame, the secondary assembling pieces being joined to the primary assembling pieces;
the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; and
the bracing piece is provided for fixing a circuit board, the bracing piece comprising a bracing body, a first suspension section, a first bearing section, and a first resilient bent section, the bracing body being fixed to the primary assembling pieces or the secondary assembling pieces or both of the primary assembling pieces and the secondary assembling pieces, the first suspension section extending from the bracing body toward one side of the bracing body, the first bearing section being spaced from the bracing body and extending from the first suspension section toward one side of the first suspension section, the first resilient bent section being located between the first bearing section and the bracing body and being bent from the first suspension section toward one side of the first suspension section, the first bearing section and the first resilient bent section resiliently clamping a first side edge of the circuit board.

14. The stereoscopic display device as claimed in claim 13, wherein:
the primary assembling pieces comprise a first primary assembling piece, a second primary assembling piece, a third primary assembling piece, and a fourth primary assembling piece; and
the first primary assembling piece, the second primary assembling piece, the third primary assembling piece, and the fourth primary assembling piece are joined to form a main frame structure of the back frame.

15. A plasma display device, wherein:
the plasma display device comprises a plasma display panel and a back frame, the back frame being arranged at a back side of the plasma display panel;

the back frame comprises at least two primary assembling pieces and also comprises secondary assembling pieces and a bracing piece for fixing a circuit board;

the at least two primary assembling pieces being connected through joining to form a main frame structure of the back frame, the secondary assembling pieces being joined to the primary assembling pieces;

the at least two primary assembling pieces comprise a primary assembling piece that has a heat source arranged thereon, the primary assembling piece that has the heat source arranged thereon having a first heat transfer capability, the remaining one or more primary assembling pieces of the at least two primary assembling pieces that have no heat source arranged thereon having a second heat transfer capability, the first heat transfer capability being greater than the second heat transfer capability; and the bracing piece is provided for fixing a circuit board, the bracing piece comprising a bracing body, a first suspension section, a first bearing section, and a first resilient bent section, the bracing body being fixed to the primary assembling pieces or the secondary assembling pieces or both of the primary assembling pieces and the secondary assembling pieces, the first suspension section extending from the bracing body toward one side of the bracing body, the first bearing section being spaced from the bracing body and extending from the first suspension section toward one side of the first suspension section, the first resilient bent section being located between the first bearing section and the bracing body and being bent from the first suspension section toward one side of the first suspension section, the first bearing section and the first resilient bent section resiliently clamping a first side edge of the circuit board.

16. The plasma display device as claimed in claim 15, wherein:

the primary assembling pieces comprise a first primary assembling piece, a second primary assembling piece, a third primary assembling piece, and a fourth primary assembling piece; and the first primary assembling piece, the second primary assembling piece, the third primary assembling piece, and the fourth primary assembling piece are joined to form a main frame structure of the back frame.

* * * * *